United States Patent [19]

Sung

[11] Patent Number: 5,648,291
[45] Date of Patent: Jul. 15, 1997

[54] METHOD FOR FABRICATING A BIT LINE OVER A CAPACITOR ARRAY OF MEMORY CELLS

[75] Inventor: Jan Mye Sung, Pu-Hsin, Taiwan

[73] Assignee: Vanguard International Semiconductor Corporation, Hsin-Chu, Taiwan

[21] Appl. No.: 657,131

[22] Filed: Jun. 3, 1996

[51] Int. Cl.$^6$ ................................................ H01L 21/70
[52] U.S. Cl. .................. 437/52; 437/60; 437/919
[58] Field of Search .................. 437/47, 48, 52, 437/60, 919

[56] References Cited

U.S. PATENT DOCUMENTS

| | | | |
|---|---|---|---|
| 5,389,566 | 2/1995 | Lage | 437/52 |
| 5,401,681 | 3/1995 | Dennison | 437/60 |
| 5,422,295 | 6/1995 | Choi | 437/52 |
| 5,521,112 | 5/1996 | Tseng | 437/52 |
| 5,554,557 | 9/1996 | Koh | 437/52 |
| 5,565,372 | 10/1996 | Kim | 437/52 |
| 5,578,516 | 11/1996 | Chou | 437/52 |
| 5,583,070 | 12/1996 | Liao et al. | 437/52 |
| 5,585,284 | 12/1996 | Park | 437/21 |

*Primary Examiner*—John Niebling
*Assistant Examiner*—Joni Y. Chang
*Attorney, Agent, or Firm*—George O. Saile; William J. Stoffel

[57] ABSTRACT

The present invention provides a method of manufacturing a bit line for a three polysilicon layer DRAM. The method begins by providing a drain region between two spaced transfer gates on a substrate, a first silicon oxide insulation layer over the drain, a capacitor having a polysilicon top plate, the polysilicon top plate extending over the drain, and an inter metal dielectric layer over the resultant structure. First, a bit line contact opening is formed in the inter metal dielectric layer stopping at the top plate over the drain. Next, anisotropic polysilicon etch is used to remove the top plate over the drain. Third, dielectric spacers are formed on the sidewalls of the bit line opening. Fourth, the bitline opening lined by the spacers is filled with a metal to contact the bit line. The spacers insulate the plate electrode from the bit line. Also, the spacers allow a smaller bit line to be used thereby making the memory cell smaller.

21 Claims, 4 Drawing Sheets

5,648,291

METHOD FOR FABRICATING A BIT LINE OVER A CAPACITOR ARRAY OF MEMORY CELLS

BACKGROUND OF THE INVENTION

1) Field of the Invention

This invention relates generally to the fabrication of semiconductor memory devices and more particularly to the fabrication of bit lines over capacitor arrays of memory cells.

2) Description of the Prior Art

The circuit density on a chip has been dramatically increased by very large scale integration (VLSI) semiconductor technologies. The miniaturized devices built in and on semiconductor substrate, making up these circuits, are very closely spaced and their packing density has increased significantly. More recent advances in photolithographic techniques, such as phase-shifting masks, and self-aligning process steps have further reduced the device size and increased circuit density. This has lead to ultra large scale integration (ULSI) with minimum device dimensions less than a micrometer and more than a million transistors on a chip. With this improved integration, some circuit elements experience electrical limitation due to their down sizing.

One such circuit element experiencing electrical limitations is the array of storage cells on a dynamic random access memory (DRAM) chip. These individual DRAM storage cells, usually consisting of a single metal-oxide-semiconductor field-effect-transistor (MOS-FET) and a single capacitor are used extensively in the electronics industry for storing data. A single DRAM cell stores a bit of data on the capacitor as electrical charge. The decrease in cell capacitance caused by reduced memory cell area is a serious obstacle to increasing packing density in dynamic random access memories (DRAMs). Thus, the problem of decreased cell capacitance must be solved to achieve higher packing density in a semiconductor memory device, since decreased cell capacitance degrades read-out capability and increases the soft error rate of memory cell as well as consumes excessive power during low-voltage operation by impeding device operation.

Generally, in a 64 MB DRAM having a 1.5 μm² memory cell area employing an ordinary two dimensional stacked capacitor cell, sufficient cell capacitance cannot be obtained even though a higher dielectric constant material, e.g., tantalum oxide ($Ta_2O_5$), is used. Therefore, stacked capacitors having a three-dimensional structure have been suggested to improve cell capacitance. Such stacked capacitors include, for example double-stacked, fin-structured, cylindrical, spread-stacked, and box structured capacitors.

Conventional capacitor DRAM arrays utilize either a buried bit line or a non-buried bit line construction. With buried bit line constructions, bit lines are provided in close vertical proximity to the bit line contacts of the memory cell field effect transistors (FETs), with the cell capacitors being formed horizontally over the top to the word lines and bit lines. With non-buried bit line constructions, deep vertical contacts are made through a thick insulation layer to the cell FETs, with the capacitor constructions being provided over the word lines and beneath the bit lines. Such non-buried bit line constructions are also referred to as "capacitor-under-bit line" or "bit line-over-capacitor" constructions and are the subject of this invention.

The following U.S. patents show related process and bit line structures: U.S. Pat. No. 5,389,566 to Lage, U.S. Pat. No. 5,422,295 to Choi et al. and U.S. Pat. No. 5,401,681 to Dennison. However, the prior art processes can be improved upon by utilizing less photo and etch steps. Many of the prior art methods require substantially more processing steps or/and planar structures which make the manufacturing process more complex and costly. Other process methods also rely on etching to a predetermined etch depth which can be quite difficult to control in a manufacturing environment. In addition, bit line contact openings often require more process tolerance to prevent the bit line contact from shorting to the word line or the capacitor plate. Moreover, memory cell size must be reduced further to achieve more minimization.

There is a challenge to develop methods of manufacturing these capacitors and bit lines that minimize the manufacturing costs and maximize the device yields. In particular, there is a challenge to develop a method which minimizes the number of photoresist masking operations and provides maximum process tolerance to maximize product yields.

SUMMARY OF THE INVENTION

It is an object of the present invention to provide a method for fabricating a bit line contact which reduces the number of photo and etches steps.

It is an object of the present invention to provide a method for fabricating a "bit line-over-capacitor" which reduces process complexity and provides additional process tolerance to reduce shorting out of the bit lines with the word lines and plate electrodes.

It is an object of the present invention to provide a method for fabricating a dynamic random access memory (DRAM) that uses only three polysilicon layers and has a bit line with a higher density which is low cost, simple to manufacture, and improves yields.

To accomplish the above objectives, the present invention provides a method of manufacturing a bit line for a high density memory device. The method begins by providing a drain 8 region between two spaced transfer gates 14 on a substrate 10, a first silicon oxide insulation layer 20 22 over the drain 8, a capacitor having a polysilicon top plate 30, the polysilicon top plate extending over the drain 8, and an inter metal dielectric layer over the resultant structure. First, a bitline contact opening is formed in the inter metal dielectric layer stopping at the first polysilicon layer (top plate) over the drain. Next, anisotropic polysilicon etch is used to remove the top plate over the drain. Third, spacers 40 are formed on the sidewalls of the bit line opening. The spacers insulate the top plate from the bit line. Also the spacers allow a smaller bit line to be used. Fourth, the bitline opening, lined by the spacer, is filled with a metal to contact the bit line.

In more detail, the present invention provides a method of manufacturing a bit line for a high density DRAM. The DRAM is formed using only three polysilicon layers. The method begins by providing a drain 8 region between two spaced transfer gates 14 on a substrate 10. Next, first silicon oxide insulation layer 20 22 is formed over the drain 8, the inside sidewalls of the transfer gates, and the top gate electrode surfaces. Storage electrodes 24 are formed over the sources 4. A capacitor dielectric layer 26 is then formed over the entire substrate surface including the storage electrodes 24.

A first polysilicon layer 30 (top plate) is formed over at least the capacitor dielectric layer 26, and the first insulation layer 22. The first polysilicon layer is preferably formed over the entire substrate surface. An inter metal dielectric layer 32 is formed over the first conductive layer 30. A first opening 38 is formed in the first inter metal dielectric layer 32 over the drain 8 exposing the first polysilicon layer 30 over the drain 8. The first opening is defined by sidewalls of the inter metal dielectric layer 32. The exposed first polysilicon layer 30 is anisotropically etched in the first opening. The anisotropic etch exposes the first silicon oxide insulation layer 22 over the drain 8. The anisotropic etch forms a sidewall of the first polysilicon layer 30 in the first opening. In an important step, a dielectric sidewall spacer is formed over the sidewalls of the inter metal dielectric layer and the first conductive layer and over the first insulation layer 22, thereby forming a second opening 38A. A bit line contact plug 50 is then then formed in the second opening contacting the drain. Lastly, passivation layers and metal layers are formed over the resultant surface to connect the devices in circuits.

The invention provides many advantages over the prior art. The invention uses only three polysilicon layers to define a DRAM cell and bit line contact. The invention reduces the masking and etching steps compared to prior art process. Moreover, the four step bit line contact window process can significantly reduce the guarding space required to prevent electrical shorts between wordlines (or capacitor top plates 30) and bit lines 50. Compared to conventional DRAM processes, the present invention reduces cell area by between 10 and 20%. The method of the present invention also uses the polysilicon layer 30 to cover the entire chip except the bit contact regions over the drain 8 where the bit lines 50 connect to the drain. This blanket coverage of the third polysilicon layer 30 (tope plate) significantly reduces soft error rates for the DRAM.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a method of forming a memory cell (e.g., DRAM) having a bit line-over-capacitor which has small dimensions, requires fewer photo steps and improves yield by increasing process tolerance. The process for forming the field oxide (FOX) and the field effect transistor structure as presently practiced in manufacturing DRAM cells are only briefly described in order to better understand the current invention. It should be will understood by one skilled in the art that by including additional process steps not described in this embodiment, other types of devices can also be included on the DRAM chip. For example, P wells in the N substrate and CMOS circuits can be formed therefrom. It should also be understood that the figures depict only one DRAM storage cell out of a multitude of cells that are fabricated simultaneously on the substrate. Also, the bit line can be used in other chip types in addition to DRAM chips.

In addition, the bit line can be used in other chip types such as SRAM, EPROM and $E^2$ROM.

Substrate 10 is understood to possibly include a semiconductor wafer, active and passive devices formed within the wafer and layers formed on the wafer surface. The term "substrate surface" is meant to include the upper most exposed layers on a semiconductor wafer, such as a silicon surface, an insulating layer and metallurgy lines.

Figure 1:
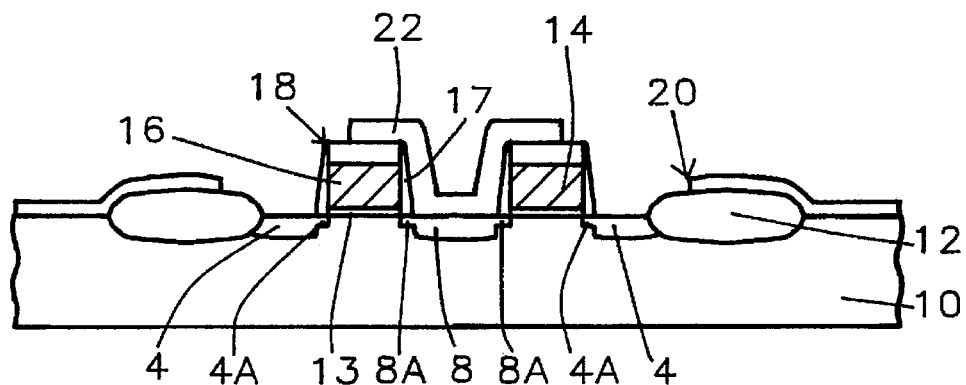
FIGS. 1 through 8 are cross sectional views illustrating the method for manufacturing a bit line for a DRAM according to the present invention.

As shown in FIG. 1, the method begins by fabricating a bit line over a substrate having a field oxide layer 12 and FET devices formed thereon. Field oxide layer 12 is formed on a semiconductor substrate 10 for defining active device regions and isolation regions. The preferred substrate is composed of a P-type single crystal silicon having a (100) crystallographic orientation. A relatively thick field oxide (FOX) 12 is formed around the active device areas to electrically isolate these areas. This field oxide is formed by masking the active device areas with a thick silicon oxide (pad oxide) and a thicker silicon nitride layer which forms an oxidation barrier. The silicon substrate is then oxidized in an oxidizing ambient to form the field oxide 12. The preferred thickness being in the range of about 4000 to 6000 Å.

The semiconductor FET device is then formed in the active device area after removing the silicon nitride barrier layer and the pad oxide in a convention wet etch. The most commonly used device for dynamic random access memory (DRAM) is MOSFET. This device is formed by first thermally oxidizing the active device area to form a thin gate oxide 13. For a 3 V supply, the preferred thickness being from about 75 to 120 Å.

An appropriately doped polysilicon layer (i.e., first polysilicon layer), and an insulating layer are deposited on substrate 10 and conventional photolithographic techniques are used to pattern the polysilicon layer, and the insulating layer which comprise the transfer gates 13 14 18 These steps form the transfer gate of the MOSFET in the active device areas. As shown in FIG. 1, two transfer gates are formed on the substrate surface disposed between field oxide regions 12. The first active regions 4 (e.g., the sources) between the transfer gates and the field oxide 12, are for electrical connection with the memory cell capacitor. The region between the transfer gates—the second active area 8 (e.g., the drain)—is for electrical connection to the bit line. Other transfer gates can be formed elsewhere on the substrate. The transfer gates can be word lines that electrically connect the MOSFET gate electrode to the appropriate peripheral circuits on the DRAM chip. The lightly doped source-drain 4A 8A of the N-channel MOSFET is formed next, usually by implanting an N-type atomic species, such as arsenic or phosphorus, through the spaces between the transfer gates 13 14 18 and the field oxide 12. For example, a typical implant might consist of phosphorus P31 at a dose of between about 1E13 and 1E14 atoms/cm$^2$ and at an energy between about 30 to 80 Kev.

After forming the lightly doped source/drain 4A 8A, sidewall spacers 16 17 are formed on the transfer gates 13 14 18 sidewalls. The sidewall spacers 17 facing the drain 8 (and layer the bit line) are called inside sidewall spacers. These sidewall spacers 16 17 are formed preferably by depositing a low temperature silicon oxide and anisotropically etching back to the silicon surface. For example, the silicon oxide could be a chemical vapor deposition using tetraethoxysilane (TEOS) at a temperature in the range of about 650° to 900° C. and the etch back performed in a low pressure reactive ion etcher.

There are at least two methods of forming the source/drain 4 8 regions. First, the source/drain regions 4 8 of the MOSFET can be implanted between the spacers 16 17 with a N type atomic species, for example, arsenic (As75), to complete the source/drain 4 8. The implantation is usually done through a thin layer of silicon oxide of about 200 to 300 Å in thickness to minimize implant channeling and to protect against contamination by metals and other impurities. A typical implantation dose being between 2E15 to 1E16 atoms/cm$^2$ and an energy of between about 20 to 70 Kev. Preferably, the N+ region 8 is formed by either an Arsenic or Phosphorous implantation with a typical dose around between about 1E15 and 1E15 atoms/cm$^2$ and more preferably of about 5E15 atoms/cm$^2$, and at an energy between about 20 and 70 Kev. The other regions are masked during this source/drain ion implant. Second, the N+ region 4 is preferably doped by impurity diffusion out of subsequently formed polysilicon layer 24 as shown in FIG. 2.

The remainder of this embodiment relates more specifically to those objects of the invention, which relate to the formation of the three polysilicon layer DRAM with a bitline having a smaller size and a more manufacturable process.

As shown in FIG. 1, first insulation layer 20 22 is formed at least over the drain 8, the inside sidewalls 17 of the transfer gates, and the top gate electrode surfaces. The first insulation layer 20 22 can be formed of silicon oxide, such as a deposited silicon oxide. The first insulation layer 20 22 can have a thickness in the range of between about 1000 to 2000 Å. Openings in the first insulation layer, over the source areas 4, are defined preferably by conventional lithography and dry etching techniques.

Figure 2:
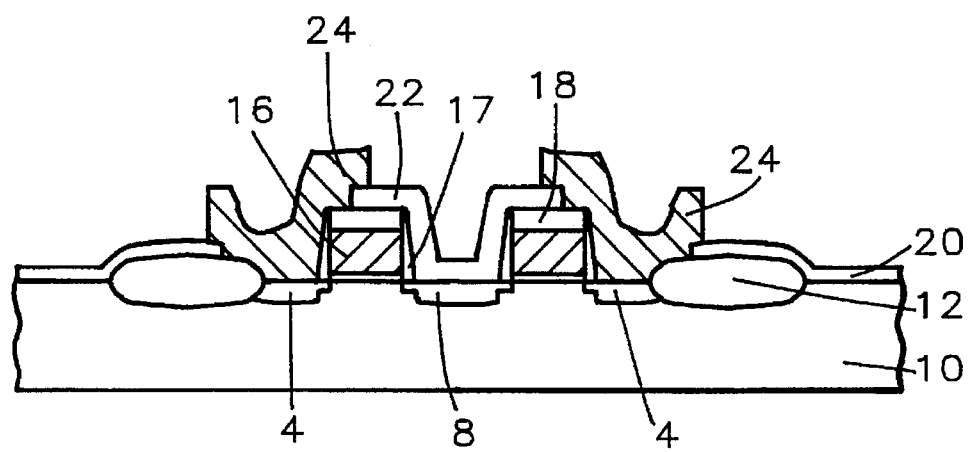

As shown in FIG. 2, storage electrodes 24 are formed over the sources 4, the outside sidewalls of the transfer gates and over portions of the top gate electrode surfaces. The storage electrodes 24 form an electrical connection to the drains 4. The storage electrodes 24 can be formed by forming and patterning an in situ doped conductive polysilicon layer (i.e., second polysilicon layer) over the resultant surface. The polysilicon layer is left covering the sources 4, the outside sidewalls 16, and portions the top transfer gate surfaces 18 thereby forming the storage electrodes 24. The storage electrodes 24 can have a thickness in the range of between about 2000 to 6000 Å. The storage electrodes 24 can have an impurity concentration in the range of between about 5E20 to 5E21 atoms/cm$^3$ and more preferably about 1E21 atoms/cm$^3$. In addition, the storage electrodes 24 can be enhanced by several techniques to increase the surface area. For example a hemispherical grain polysilicon (HSG) layer could be formed over the storage electrode as described in U.S. Pat. No. 5,401,681 to Dennison. Also, the N+ regions 4 are preferably doped by impurity diffusion out of doped polysilicon layer 24 as shown in FIG. 2.

Figure 3:
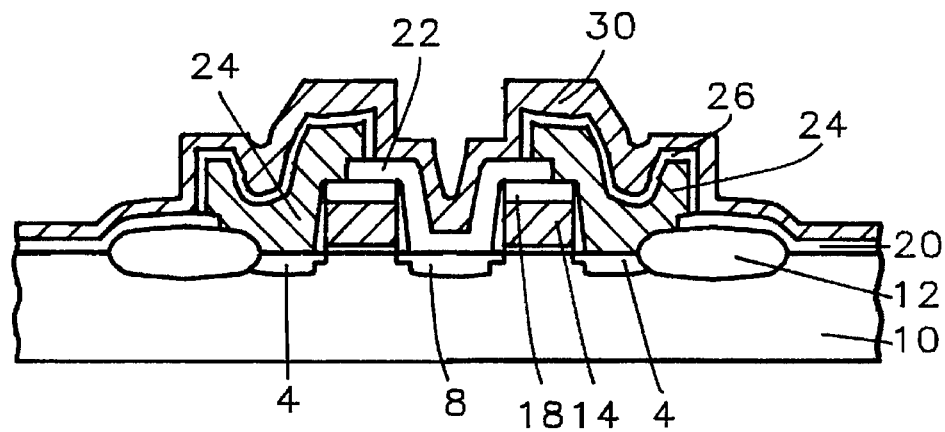

As shown in FIG. 3, a capacitor dielectric layer 26 is deposited over the storage electrodes 24. The material of the dielectric layer 26 can be any suitable materiel having a high dielectric constant and being continuous and pinhole free. The conformal dielectric layer 26 can be formed of silicon nitride, an oxide/nitride/oxide (ONO) film, tantalum pentoxide (Ta$_2$O$_5$), and silicon oxide material. For a 3 V supply, the conformal dielectric layer 26 preferably has an equivalent oxide thickness in the range between about 45 to 60 Å.

Figure 4:
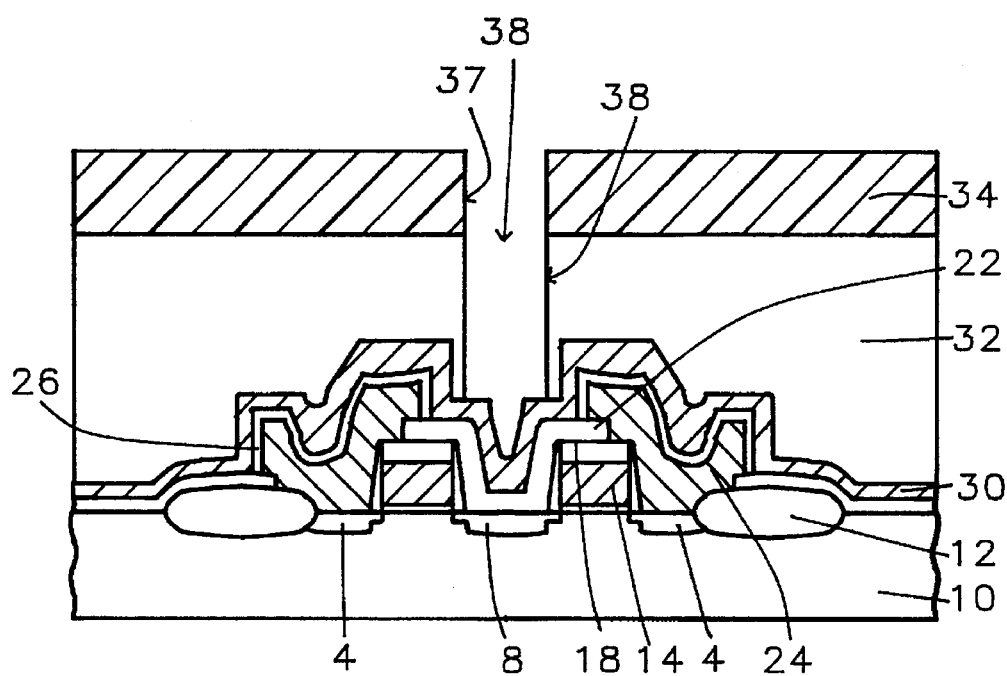

Now turning to FIG. 4, a top plate electrode 30 is formed over the dielectric layer. This is accomplished by forming a first conductive layer 30 over the substrate surface. The first conductive layer 30 can be formed of tungsten silicide, or a doped polycrystalline silicon material. The first conductive layer is preferably composed of polysilicon formed using a LPCVD (low pressure chemical vapor deposition) reactor at a process temperature of between about 550° to 650° C. The polysilicon layer can be doped N-type by ion implantation using, for example, arsenic ions and having an implant dose of between about 1E15 to 20E15 atoms/cm$^2$ and an ion energy of between about 20 to 80 Kev. Alternately, the polysilicon layer can be doped in situ during the polysilicon deposition. The first conductive layer 30 preferably has a thickness in the range between about 1000 to 2000 Å. The first conductive layer can have an impurity concentration in the range of between about 1E21 to 5E22 atoms/cm$^3$ and more preferably about 1E22 atoms/cm$^3$.

In the invention, the third polysilicon layer 30 (top plate) preferably covers the entire chip except the bit contact region over the drain 8 where the bit lines 50 connect to the drain. This blanket coverage of the third polysilicon layer 30 significantly reduces soft error rates.

As shown in FIG. 4, an inter metal dielectric layer 32 over is formed over the first conductive layer 30. The inter metal dielectric layer 32 is preferably formed of borophosphosilicate glass (BPSG), or undoped TEOS (silicon oxide), and has a thickness in the range of between about 5000 and 10,000 Å.

Next, a first opening 38 is formed in the first inter metal dielectric layer 32 over the drain 8 exposing the first conductive layer 30 over the drain 8. The first opening is defined by sidewalls of the inter metal dielectric layer 32 and the first insulation layer 32. As displayed in FIG. 4, the formation of the first opening in the first inter metal dielectric layer comprises forming a first resist layer 34 having a contact window 37, anisotropically etching the first inter metal dielectric layer through the contact window 37, and then removing the first resist layer. The first opening 38 in the inter metal dielectric layer has an open dimension in the range of the minimum dimension allowed by design rules and has depth in the range of between about 5000 and 10,000 Å.

Figure 5:
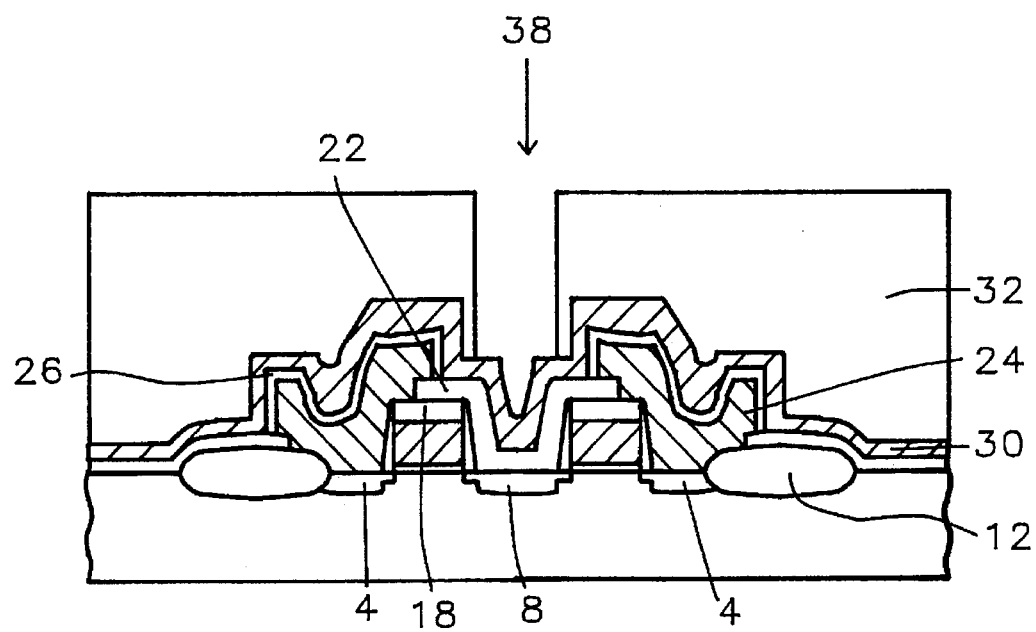

As FIG. 5 displays, the exposed first conductive layer 30 in the first opening 38 is removed by an anisotropic etch. The anisotropic etch exposes the first insulation layer 22 over the drain 8. The anisotropic etch forms sidewalls in the first conductive layer 30 in the first opening. The anisotropic etch can be a dry polysilicon etch with a high selectivity of polysilicon over silicon oxide. The anisotropic etch is preferably a dry etch using a chloride (Cl) containing reactant, such as CF$_2$—Cl$_2$.

Figure 6:
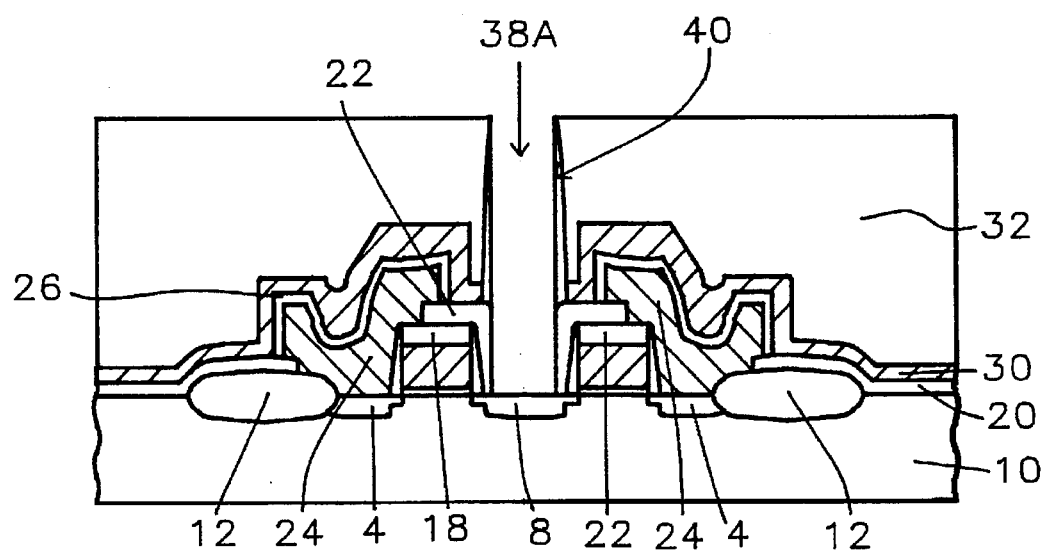

As shown in FIG. 6, dielectric sidewall spacers 40 are formed on the sidewalls of the inter metal dielectric layer 32 and the first conductive layer 30. The sidewalls spacers 40 at least partially define a second opening 38A. The sidewall spacers 40 can be formed by depositing a dielectric layer of oxide or nitride over the sidewalls of the inter metal dielectric layer 32, over the first conductive layer in the first opening, and over the first insulation layer 22. Then, through the first opening, the dielectric layer and the first insulation layer are anisotropically etched exposing the drain 8 and thereby forming a second opening 38A (i.e., bit line contact opening). This etch defines the dielectric spacers 40 on the sidewalls of the inter metal dielectric layer and the first conductive layer 30. Preferably the spacers 40 are formed of nitride and preferably have a width in the range of between about 400 and 600 Å and more preferably about 500 Å.

Figure 7:
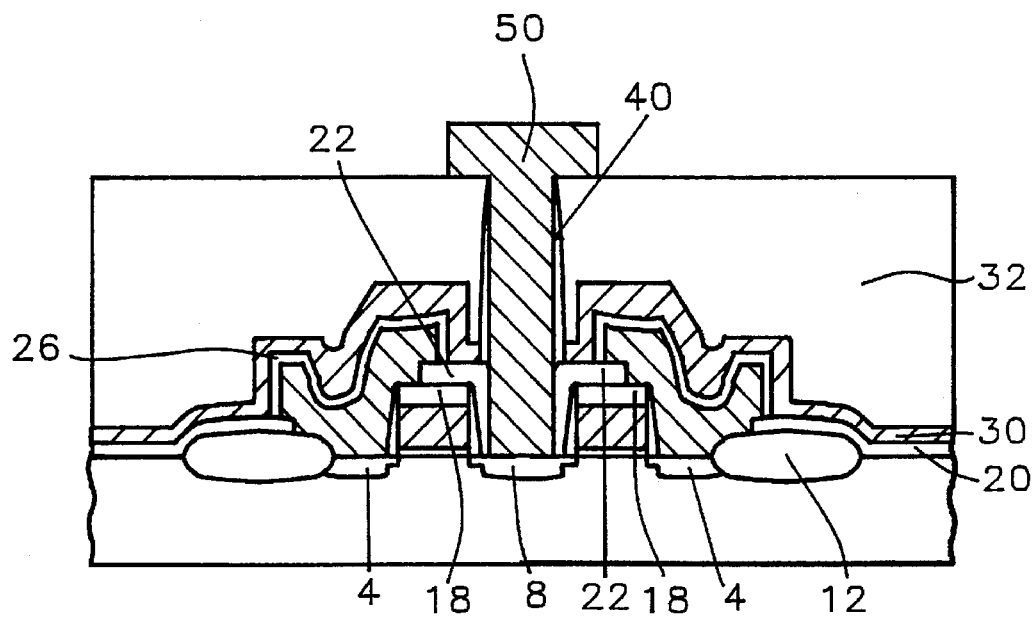

As shown in FIG. 7, a bit line contact plug 50 is formed in the second opening 38A contacting the drain. The bit line contact plug 50 is preferably formed of tungsten or aluminum. The bit line contact can be made by depositing a conductive layer in the second opening 38A and over the inter metal dielectric layer. The conductive layer over the inter metal dielectric layer is then preferably patterned.

Figure 8:
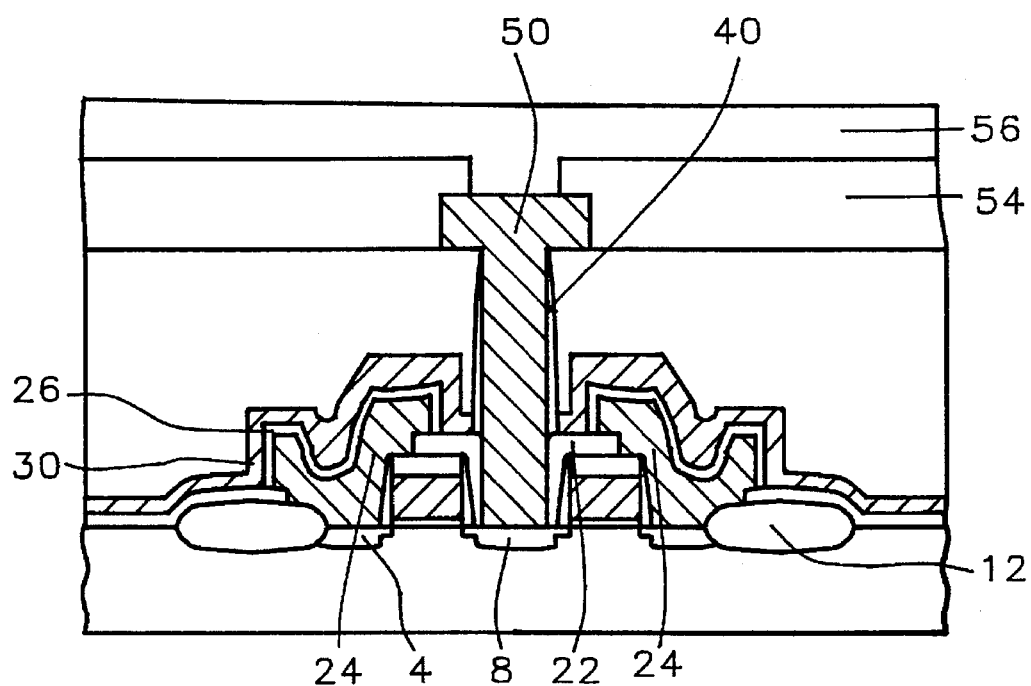

As shown in FIG. 8, a passivation layer 54 is deposited and patterned to provide a contact opening downward to the bit line plug 50. The passivation layer is preferably formed of borophosphosilicate glass (BPSG). A digit line material 56 is deposited and patterned to provide desired digit lines (e.g., patterned metal lines).

Therefore, the present invention provides a method of forming a DRAM cell using only three polysilicon layers 14 24 30. The invention reduces the masking and etching steps compared to prior art process, such as a four polysilicon layer DRAM process. In comparison to a conventional four polysilicon layer DRAM cell method, the present invention eliminates two lithography steps, two RIE etch steps and the bitline polysilicon module. Moreover, the four step bit line contact window process can significantly reduce the guarding space required to prevent electrical shorts between wordlines (or capacitor top plates) and bit lines. This allows the DRAM cell size to be further decreased.

The method of the present invention also uses the polysilicon layer 30 (top plate) to cover the entire chip except the bit contact region over the drain 8 where the bit lines 50 connect to the drain. This blanket coverage of the third polysilicon layer 30 over the substrate surface significantly reduces soft error rates.

While the figures show a stacked capacitor, the bit line method of the present invention can be used with any kind of capacitor, such as stack and cylindrical capacitors, as is obvious to those skilled in the art.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of a bit line over a capacitor of a semiconductor memory cell, providing a drain region between two spaced transfer gates on a substrate, said spaced transfer gates having sources on the sides opposite said drain; said spaced transfer gates having inside sidewalls facing said drain and having outside sidewalls facing said sources; and said spaced transfer gates having top transfer gate surfaces; said substrate having spaced field oxide regions defining active areas containing said source and drains; comprising the steps of:

a) forming a first insulation layer at least over said drain, said inside sidewalls of said transfer gates, and said top gate electrode surfaces;

b) forming storage electrodes over said sources, said outside sidewalls of said transfer gates, and over portions of said top transfer gate surfaces; said storage electrodes forming an electrical connection to said drains;

c) forming a capacitor dielectric layer over said storage electrodes;

d) forming a first conductive layer over at least said capacitor dielectric layer, and said first insulation layer;

e) forming an inter metal dielectric layer over said first conductive layer;

f) forming a first opening in said first inter metal dielectric layer over said drain exposing said first conductive layer over said drain; said first opening defined at least by sidewalls of said inter metal dielectric layer;

g) anisotropically etching said exposed first conductive layer in said first opening; the anisotropic etch exposing said first insulation layer over said drain; the anisotropic etch forming sidewalls in said first conductive layer in said first opening;

h) forming dielectric spacers on the sidewalls of said inter metal dielectric layer and said first conductive layer; and forming a second opening defined by at least said dielectric spacers; and i) forming a bit line contact plug in said second opening contacting said drain.

2. The method of claim 1 wherein said step (b), the formation of said storage electrode comprises forming a polysilicon layer over said sources and transfer gates; and masking and etching said polysilicon layer leaving the polysilicon layer over said drain, said outside sidewalls, and portions said top gate electrode surfaces.

3. The method of claim 1 wherein said first conductive layer is composed of doped polysilicon having an impurity concentration in the range of between about 1E15 to 2E16 atoms/cm$^2$ and said first conductive layer has a thickness in the range of between about 1000 and 2000 Å and said first conductive layer is formed over the entire substrate surface.

4. The method of 1 wherein said step (f), the formation of said first opening in said first inter metal dielectric layer comprises forming a first resist layer having a contact window; and anisotropically etching said first inter metal dielectric layer through said contact window and removing said first resist layer.

5. The method of claim 1 wherein said dielectric layer is composed of a material selected from the group consisting of silicon oxide, and silicon nitride; and said dielectric layer has a thickness in the range of between about 45 and 60 Å.

6. The method of claim 1 wherein in step (g) said anisotropic etch is a reactive ion etch containing a chloride gas.

7. The method of claim 1 wherein said first insulation layer is formed of silicon oxide having a thickness in the range of between about 1000 and 2000 Å.

8. The method of claim 1 wherein said inter metal dielectric layer is formed of BPSG and has a thickness in the range of between about 5000 and 10,000 Å.

9. The method of claim 1 wherein said dielectric spacers are formed by forming a dielectric layer over said sidewalls of said inter metal dielectric layer and said first conductive layer in said first opening and over said first insulation layer; and anisotropically etching, through said first opening, said dielectric layer and said first insulation layer exposing said drain thereby forming a second opening and defining dielectric spacers on the sidewalls of said inter metal dielectric layer and said first conductive layer.

10. The method of claim 1 which further includes forming a passivation layer and a patterned metal layer over said inter metal dielectric layer and said bit line plug.

11. The method of claim 1 wherein said spacers are formed of a material selected from the group consisting of: silicon oxide and silicon nitride; and have a thickness in the range of between about 400 and 600 Å.

12. A method of fabrication a three polysilicon layer DRAM having a bit line over a capacitor, providing a drain region between two spaced transfer gates on a substrate, aid spaced transfer gates having sources on the sides opposite said drain; said spaced transfer gates having inside sidewalls facing said sources and having outside sidewalls facing said drain; and said spaced transfer gates having top gate electrode surfaces; said substrate having spaced field oxide regions defining active areas containing said source and drains; comprising the steps of:

a) forming first insulation layer composed of silicon oxide at least over said drain, said inside sidewalls of said transfer gates, and said top transfer gate surfaces;

b) forming storage electrodes over said sources, said outside sidewalls of said transfer gates and over portions of said top gate electrode surfaces; said storage electrodes forming an electrical connection to said drains;

c) forming a capacitor dielectric layer over said storage electrodes;

d) forming a first conductive layer composed of polysilicon over the entire substrate surface including said capacitor dielectric layer, and said first insulation layer;

e) forming an inter metal dielectric layer composed of undoped silicon oxide over said first conductive layer;

f) forming a first opening in said first inter metal dielectric layer over said drain exposing said first conductive layer over said drain; said first opening defined by sidewalls of said inter metal dielectric layer;

g) anisotropically etching said exposed first conductive layer in said first opening; said anisotropic etch exposing said first silicon oxide insulation layer over said drain; said anisotropic etch forming sidewalls of said first polysilicon layer in said first opening;

h) forming a dielectric layer over said sidewalls of said inter metal dielectric layer and said first conductive layer in said first opening and over said first insulation layer;

i) anisotropically etching, through said first opening, said dielectric layer and said first insulation layer exposing said drain thereby forming a second opening and defining dielectric spacers on the sidewalls of said inter metal dielectric layer and said first conductive layer; and j) forming a bit line contact plug in said second opening contacting said drain.

13. The method of claim 12 wherein said step (b), the formation of said storage electrode comprises forming a polysilicon layer over said sources and transfer gates; and masking and etching said polysilicon layer leaving the polysilicon layer over said drain, said outside sidewalls, and portions said top gate electrode surfaces.

14. The method of claim 12 wherein said first conductive layer is composed of doped polysilicon having an impurity concentration in the range of between about 1E15 to 2E16 atoms/cm$^2$ and said first conductive layer has a thickness in the range of between about 1000 and 2000 Å.

15. The method of claim 12 wherein said step (f), the formation of said first opening in said first inter metal dielectric layer comprises forming a first resist layer having a contact window; and anisotropically etching said first inter metal dielectric layer through said contact window and removing said first resist layer.

16. The method of claim 12 wherein said dielectric layer is composed of a material selected from the group consisting of silicon oxide, and silicon nitride; and said dielectric layer has a thickness in the range of between about 45 and 60 Å.

17. The method of claim 12 wherein in step (g) said anisotropic etch is a reactive ion etch containing a chloride gas.

18. The method of claim 12 wherein said first insulation layer is formed of silicon oxide having a thickness in the range of between about 1000 and 2000 Å.

19. The method of claim 12 wherein said inter metal dielectric layer is formed of borophosphosilicate glass (BPSG) and has a thickness in the range of between about 5000 and 10,000 Å.

20. The method of claim 12 wherein said dielectric spacers are formed of a material selected from the group consisting of silicon oxide and silicon nitride; and have a thickness in the range of between about 400 and 600 Å.

21. The method of claim 12 which further includes forming a passivation layer and a patterned metal layer over said inter metal dielectric layer and said bit line plug.

* * * * *